United States Patent [19]

Esterson et al.

[11] 4,296,385

[45] Oct. 20, 1981

[54] X-RAY ASSISTED MULTIPACTOR DISCHARGE TUNED RESONANT CAVITY DEVICE

[75] Inventors: Maurice Esterson, Chelmsford; Michael B. C. Brady, Maldon, both of England

[73] Assignee: English Electric Valve Company, Chelmsford, England

[21] Appl. No.: 124,126

[22] Filed: Feb. 25, 1980

Related U.S. Application Data

[63] Continuation of Ser. No. 12,725, Feb. 16, 1979, abandoned, which is a continuation of Ser. No. 734,882, Oct. 22, 1976, abandoned.

[30] Foreign Application Priority Data

Oct. 24, 1975 [GB] United Kingdom ............... 43705/75

[51] Int. Cl.[3] .......................... H01P 1/14; H03B 9/10

[52] U.S. Cl. .................................. 331/90; 315/39.57; 333/13; 333/99 MP

[58] Field of Search ............................ 331/86, 90, 96; 315/39.55, 39.57; 333/99 MP, 13; 313/103 R, 104

[56] References Cited

U.S. PATENT DOCUMENTS 2,925,528 2/1960 Hartnell-Beavis .............. 313/103 X 3,885,221 5/1975 Lewis ......................... 333/99 MP X

FOREIGN PATENT DOCUMENTS 1382502 2/1975 United Kingdom .................. 331/86

1382630 2/1975 United Kingdom .................. 331/86

*Primary Examiner*—Siegfried H. Grimm

*Attorney, Agent, or Firm*—Diller, Ramik & Wight

[57] ABSTRACT

A multipactor discharge tuned resonant cavity device, e.g. a magnetron, is irradiated with X-rays in order to assist the starting of the multipactor discharge. The X-rays are produced by electrons striking the surface of the magnetron anode.

3 Claims, 1 Drawing Figure

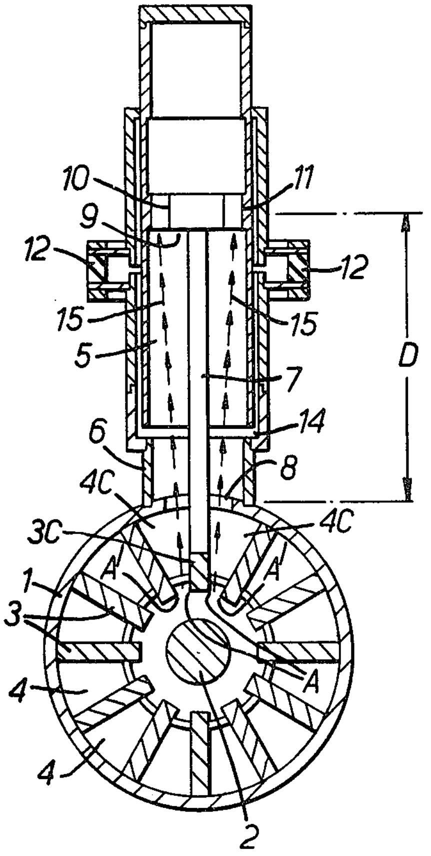
10
11
9
12
12
15
15
5
7
D
6
14
8
4C
4C
3C
A
A
1
3
A
4
4
2

X-RAY ASSISTED MULTIPACTOR DISCHARGE TUNED RESONANT CAVITY DEVICE

This is a continuation of application Ser. No. 012,725, filed Feb. 16, 1979 and which in turn was a continuation of application Ser. No. 734,882, filed Oct. 22, 1976, both applications now being abandoned.

This invention relates to multipactor discharge tuned resonant cavity devices and in particular to multipactor discharge tuned magnetron oscillators.

It is known from our prior U.K. patent specification No. 1,334,001 (U.S. Pat. No. 3,748,592) to provide a separate resonator coupled to a cavity of a resonant cavity device (in this case a magnetron oscillator) with a multipactor discharge arrangement arranged to influence the separate resonator in such manner that when said multipactor arrangement is permitted to discharge (usually by removing a bias voltage) the operating frequency of the resonant cavity device changes from one value to another.

In many cases, it is desirable to assist the starting of the discharge of the multipactor discharge arrangement and in our earlier specification referred to above, a multipactor discharge tuned magnetron oscillator is described in which the multipactor discharge arrangement is provided with a thermionic cathode and a heater for this purpose.

The present invention seeks to provide an improved multipactor discharge tuned resonant cavity device having improved means for assisting in the start of the multipactor discharge.

According to this invention, a multipactor discharge tuned resonant cavity device is provided wherein in order to assist the starting of the discharge of said multipactor arrangement means are provided whereby said multipactor discharge arrangement is irradiated with X-rays.

Where said resonant cavity device is a magnetron oscillator, said multipactor discharge arrangement may be arranged to be irradiated by X-rays generated within the magnetron in operation by electrons striking the surface of the magnetron anode.

In one embodiment of the present invention, a multipactor tuned magnetron oscillator is provided having a separate resonator which is coupled to one or more resonant cavities of the magetron oscillator, said separate resonator comprising a length of co-axial transmission line, the outer conductor of which terminates at the anode wall of said magnetron oscillator and the inner conductor of which extends through an aperture provided in said anode wall, and a multipactor discharge arrangement is provided to terminate the end of the co-axial transmission line remote from said anode wall, the whole arrangement being such that X-rays generated within said magnetron oscillator can pass through said aperture and via the space between said inner end outer conductors of said co-axial transmission line to irradiate said multipactor discharge arrangement.

The invention is illustrated is and further described with reference to the accompanying drawing which is a section through one magnetron oscillator in accordance with the present invention.

Referring to the drawing, the magnetron oscillator will be seen to be of the vane type. The arrangement consists of cylindrical anode member 1 surrounding a cylindrical cathode member 2. From anode member 1 extend inwardly radial vanes 3. The anode member 1 with its vanes 3 from cavities 4 of which in this example there are twelve, which determine the natural resonant frequency of the magnetron oscillator. A separate resonator is provided, consisting of a length of coaxial transmission line 5 coupled to two adjacent ones of the resonant cavities 4. The reference numerals for these two adjacent cavities bear the suffix "C". The co-axial outer conductor 6 of the co-axial transmission line 5 terminates at the wall of the anode member 1, whilst the inner conductor 7 extends through a hole 8 in the wall of the anode member 1 and is connected to one of the vanes 3 (the reference numeral for which bears the suffix "C"), which is between the two adjacent cavities 4C. The end of the transmission line 5, remote from the wall of the anode member 1, is terminated by a multipactor discharge arrangement 9 which is in accordance with the invention in our U.S. Pat. No. 4,105,951, having as it does multipactor electrodes in the form of co-axial cylinders 10 and 11. The outer cylinder 11 is connected to the outer conductor 6 of the transmission line 5 whilst the inner cylinder 10 is connected to and carried by the inner conductor 7 of the transmission line 5.

In order to provide for DC biassing and triggering connections (not shown), the inner and outer conductors 10, 11 of the co-axial line 5 must be insulated so far as DC is concerned. This is achieved by means of an insulator 12 positioned half-way along a half-wave choke arrangement 14 provided as known per se.

The distance separating the multipactor discharge arrangement 9 from the wall of anode member 1, that is to say the dimension "D", is approximately $\frac{3}{4}\lambda$. In fact the multipactor discharge arrangement 9 is positioned where the R.F. voltage is at a maximum along the transmission line 5 from the wall of anode member 1.

As used throughout the specification "λ" should be taken to be the wavelength corresponding to the mean frequency between the two extremes of frequency obtained as a result of being able to modify the operating frequency of the magnetron oscillator by initiating and inhibiting the discharge of the multipactor discharge arrangement 9.

The coupling hole 8 breaks through the wall of anode member 1 into both adjacent cavities 4C. The diameter of the coupling hole 8 is at least as great as the distance between the centre of one vane 3 and the tips A and A′ of the next vane 3 measured along the periphery of the anode. During operation X-rays will be generated at the tips A (or A′ depending upon the direction of the axial magnetic field) and pass through the hole 8 to irradiate the gap surfaces (i.e. the interior of external cylinder 11 and the exterior of internal cylinder 10) of the multipactor discharge arrangement 9, as represented by the dashed arrowed lines 15.

This irradiation of the multipactor discharge gap surfaces acts to cause emission of photo-electrons which enhance the starting of discharge between the two surfaces.

If desired, further separate resonators and multipactor arrangements may be provided, coupled to others of the cavities 4.

We claim:

1. A multipactor tuned magnetron oscillator comprising an anode body having a generally cylindrical anode wall, a cathode disposed substantially concentrically within said anode wall, a plurality of vanes within said anode body and defining a plurality of resonant cavities therewithin, at least some of said vanes extending radially inwardly from said anode wall toward said cathode, said anode wall having an opening therein, an inner conductor extending substantially centrally through said opening and substantially radially into and out of said anode body so as to be coupled with at least one of said cavities, a cylindrical outer conductor connected to said anode wall and extending outwardly thereform in concentric relation to said inner conductor to form therewith a coaxial transmission line, a multipactor discharge device terminating said transmission line in outwardly spaced relation to said anode wall, said multipactor discharge device comprising a cylindrical inner electrode connected to and coaxial with said inner conductor and a cylindrical outer electrode concentric with said inner electrode and connected to said outer conductor, the inner and outer electrodes presenting mutually opposed and concentrically spaced surfaces which define a multipactor discharge gap, each of said vanes terminating in spaced relation to said cathode and defining a tip at which X-rays are generated during operation of the oscillator, and said opening having a diameter which is sufficiently large and said multipactor discharge gap surfaces being sufficiently spaced whereby generated X-rays pass in straight line fashion through said opening and into said discharge gap to directly irradiate at least one of said discharge gap surfaces sufficiently to cause emission of photoelectrons which enhance the starting of multipactor discharge between said gap surfaces.

2. A multipactor tuned magnetron oscillator as defined in claim 1 including a further vane connected to that end of said inner conductor within said anode body, said further vane terminating in a tip spaced from said anode and extending radially outwardly from such tip toward but spaced inwardly from said anode wall, said inner electrode being of larger diameter than said inner conductor.

3. A multipactor tuned magnetron oscillator as defined in claim 1 or 2 wherein said opening has a diameter at least as great as the distance between the center of one vane and tips of the next adjacent vane measured along the periphery of said anode body.

* * * * *